(12) United States Patent
Tominaga et al.

(10) Patent No.: US 7,667,971 B2
(45) Date of Patent: Feb. 23, 2010

(54) ELECTRONIC CONTROL DEVICE AND METHOD OF MANUFACTURING ELECTRONIC CONTROL DEVICE

(75) Inventors: Tsutomu Tominaga, Chiyoda-ku (JP); Takayuki Kifuku, Chiyoda-ku (JP); Shuzo Akiyama, Chiyoda-ku (JP); Masaaki Tanigawa, Bunkyo-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/153,117

(22) Filed: May 14, 2008

(65) Prior Publication Data

US 2009/0122489 A1 May 14, 2009

(30) Foreign Application Priority Data

Nov. 13, 2007 (JP) ............................. 2007-294200

(51) Int. Cl.
  *H05K 7/20* (2006.01)
(52) U.S. Cl. ................... 361/706; 361/707; 361/709; 361/715; 361/719
(58) Field of Classification Search ............... 361/709, 361/715
  See application file for complete search history.

(56) References Cited

U.S. PATENT DOCUMENTS

| | | | | |
|---|---|---|---|---|
| 6,078,155 | A * | 6/2000 | Tominaga et al. | 318/293 |
| 6,548,972 | B2 * | 4/2003 | Takagi | 318/293 |
| 6,560,115 | B1 * | 5/2003 | Wakabayashi et al. | 361/728 |
| 6,724,627 | B2 * | 4/2004 | Onizuka et al. | 361/704 |
| 7,021,418 | B2 * | 4/2006 | Tominaga et al. | 180/444 |
| 7,081,691 | B2 * | 7/2006 | Kawata | 307/9.1 |
| 7,154,753 | B2 * | 12/2006 | Kobayashi | 361/715 |
| 2005/0190539 | A1 * | 9/2005 | Watanabe et al. | 361/704 |
| 2008/0157680 | A1 * | 7/2008 | Tominaga et al. | 315/112 |
| 2008/0158823 | A1 * | 7/2008 | Tominaga et al. | 361/709 |
| 2008/0158830 | A1 * | 7/2008 | Tominaga et al. | 361/722 |
| 2008/0278918 | A1 * | 11/2008 | Tominaga et al. | 361/719 |

FOREIGN PATENT DOCUMENTS

| | | | |
|---|---|---|---|
| JP | 7-297576 | A | 11/1995 |
| JP | 08-258730 | A | 10/1996 |

(Continued)

*Primary Examiner*—Gregory D Thompson
(74) *Attorney, Agent, or Firm*—Sughrue Mion, PLLC

(57) ABSTRACT

Provided is an electronic control device, including: a housing (3) which includes opening portions at both end portions thereof and is made of insulating resin; a heat sink (5) attached to one of the end portions of the housing (3); a power device (2) provided to the heat sink (5); a circuit board (4) which is provided so as to be opposed to the heat sink (5) and formed with an electronic circuit including a control circuit for controlling the power device (2); and a plurality of first conductive plates (6) held in the housing (3), for electrically connecting the circuit board (4) with the power device (2), in which each of the plurality of first conductive plates (6) includes a press fit terminal (6*bp*) press-fitted into a through hole (4*a*) formed in the circuit board (4) to be bonded to the circuit board (4) on a surface opposed to the circuit board (4) and to be bonded to respective terminals of the power device (2) on a surface opposed to the heat sink (5). Accordingly, an electronic control device whose size and cost are reduced and whose electrical connection reliability is improved is obtained.

17 Claims, 8 Drawing Sheets

FOREIGN PATENT DOCUMENTS

| | | |
|---|---|---|
| JP | 2002-293202 A | 10/2002 |
| JP | 2003-309384 A | 10/2003 |
| JP | 2004-254359 A | 9/2004 |
| JP | 3644835 B2 | 2/2005 |
| JP | 2005-294252 A | 10/2005 |
| JP | 2007-030652 A | 2/2007 |

* cited by examiner

ELECTRONIC CONTROL DEVICE AND METHOD OF MANUFACTURING ELECTRONIC CONTROL DEVICE

BACKGROUND OF THE INVENTION

1. Field of the Invention

The present invention relates to an electronic control device, and more particularly, to an electronic control device used for an electric power steering apparatus for assist-urging a steering apparatus of a vehicle by a torque of an electric power motor.

2. Description of the Related Art

Up to now, there has been known an electronic control device in which a semiconductor switching device (for example, a FET) serving as a power device is mounted to a metal board and a connection member for electrically connecting the metal board with parts located outside the metal board is attached onto the metal board.

For example, a conventional electronic control device includes a power board in which a bridge circuit having semiconductor switching devices for switching a current of an electric power motor is contained, a housing in which a conductive plate and the like which are inserted into an insulating resin by molding and large-current parts are contained, a control board in which small current parts such as microcomputers are contained, a connection member for electrically connecting the power board, the housing, and the control board with one another, a heat sink brought into close contact with the power board, and a case which is provided to cover the power board, the housing, and the control board, formed by press molding using a metal plate, and attached to the heat sink (see, for example, JP 3644835 B).

However, the conventional technology has the following problems.

The electronic control device described in JP 3644835 B requires the metal board containing the semiconductor switching devices. The connection member is fixed onto the metal board so as to prevent the connection member from floating at the time of soldering. As a result, there is a problem that the number of parts increases to increase a size of the electronic control device and a cost thereof.

An impact force caused when the connection member is fixed onto the power board is transferred to parts such as the semiconductor switching devices which are located on the power board before soldering, so a displacement in position of each of the parts occurs. Therefore, there is a problem that the reliability of soldering bonding of the parts mounted to the power board reduces.

SUMMARY OF THE INVENTION

The present invention has been made to solve the above-mentioned problems. An object of the present invention is to obtain an electronic control device whose size and cost are reduced and whose electrical connection reliability is improved.

An electronic control device according to the present invention includes: a housing which includes opening portions at both end portions thereof and is made of insulating resin; a heat sink attached to one of the end portions of the housing; a power device provided to the heat sink; a circuit board which is provided so as to be opposed to the heat sink and formed with an electronic circuit including a control circuit for controlling the power device; and a plurality of first conductive plates held in the housing, for electrically connecting the circuit board with the power device, in which each of the plurality of first conductive plates includes a press fit terminal press-fitted into a through hole formed in the circuit board to be bonded to the circuit board on a surface opposed to the circuit board and to be bonded to respective terminals of the power device on a surface opposed to the heat sink.

According to the present invention, in the electronic control device, the conductive plate is used for electrically connecting the power device to the circuit board to remove a part such as a power board, thereby reducing a size and a cost and improving electrical connection reliability. Therefore, it is possible to obtain the electronic control device whose size and cost are reduced and whose electrical connection reliability is improved.

DESCRIPTION OF THE PREFERRED EMBODIMENT

Hereinafter, an embodiment of the present invention will be described with reference to the attached drawings. In each of the drawings, the same or similar members and portions will be expressed by the same symbols and described.

Embodiment 1

In Embodiment 1, an electronic control device used for an electric power steering apparatus for assist-urging a steering apparatus of a vehicle by a torque of an electric power motor will be described as an example.

Figure 1:
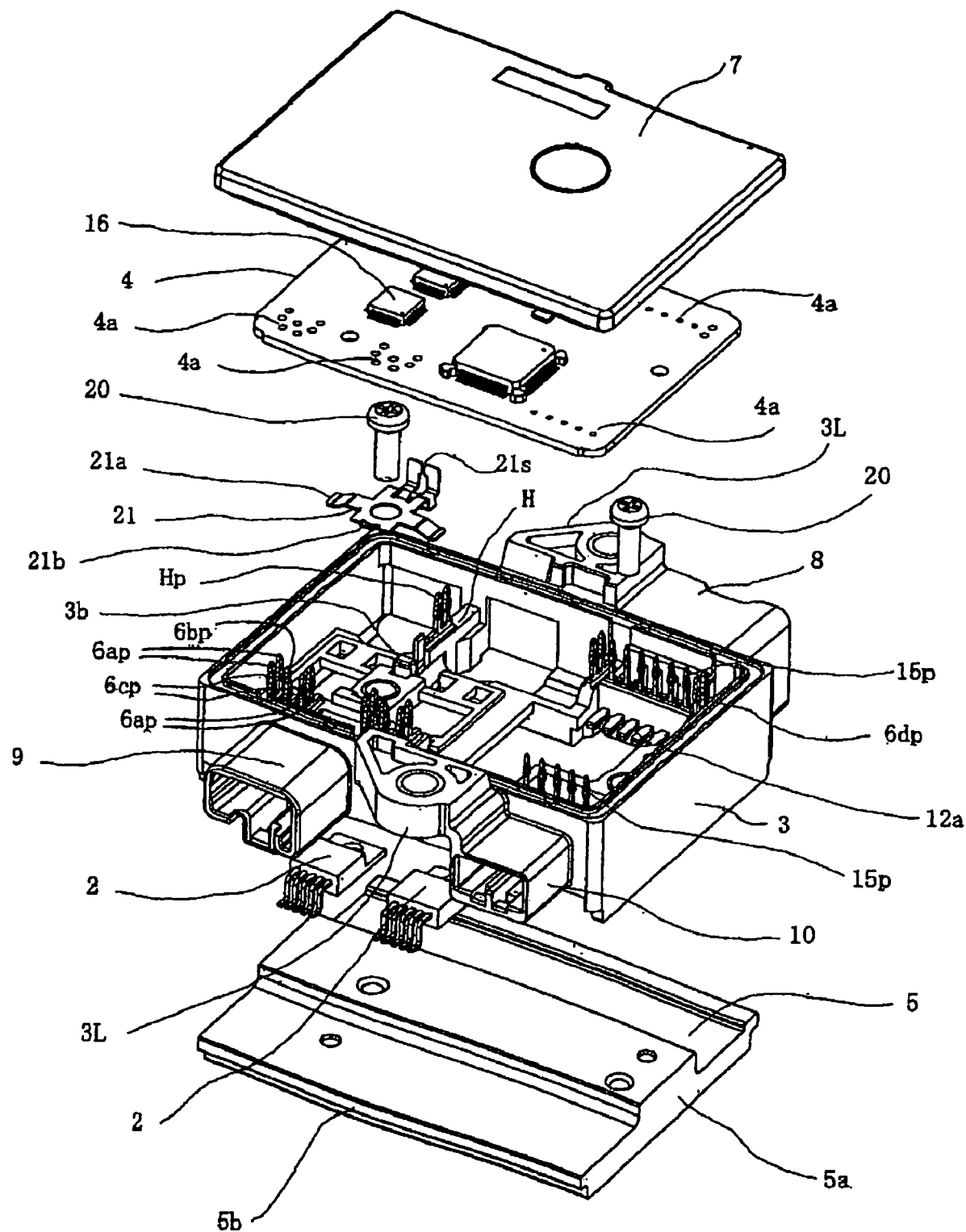
FIG. 1 is an exploded perspective view showing an electronic control device according to Embodiment 1 of the present invention.
Figure 2:
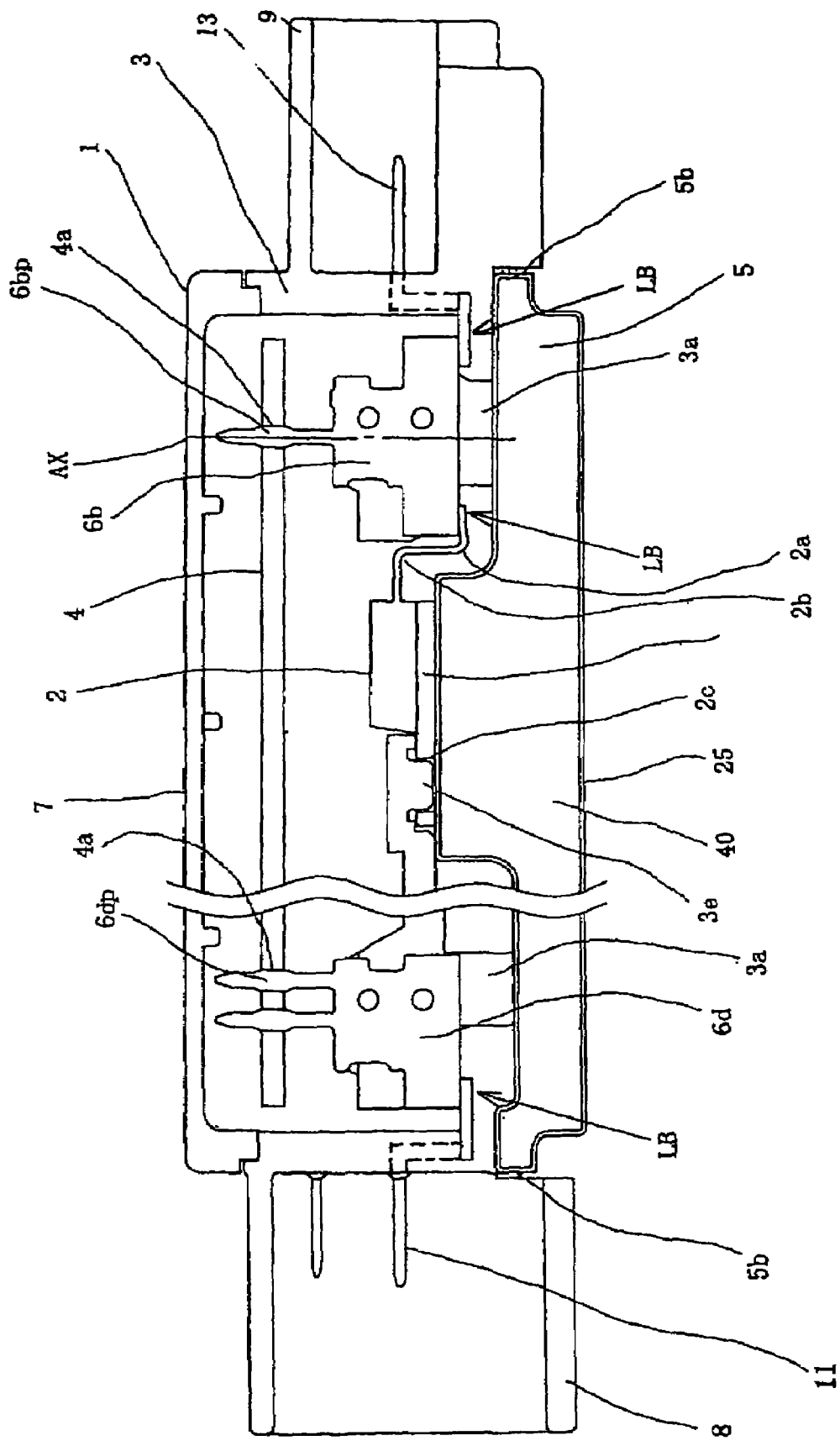
FIG. 2 is a cross sectional view showing the electronic control device of FIG. 1 according to Embodiment 1 of the present invention.
Figure 3:
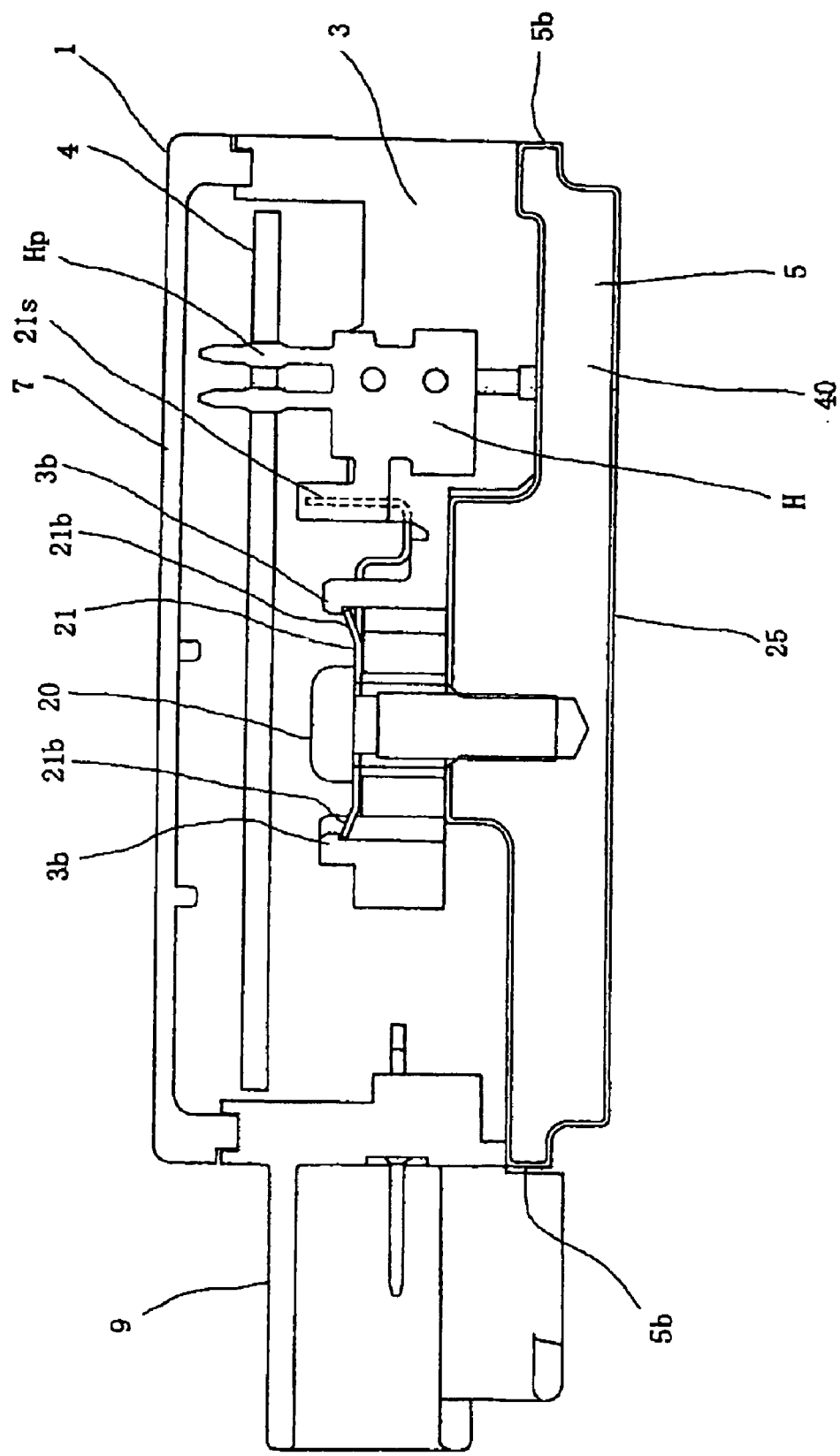
FIG. 3 is a cross sectional view obtained by cutting at a position parallel to the cross section of the electronic control device as shown in FIG. 2 in Embodiment 1 of the present invention.
Figure 4:
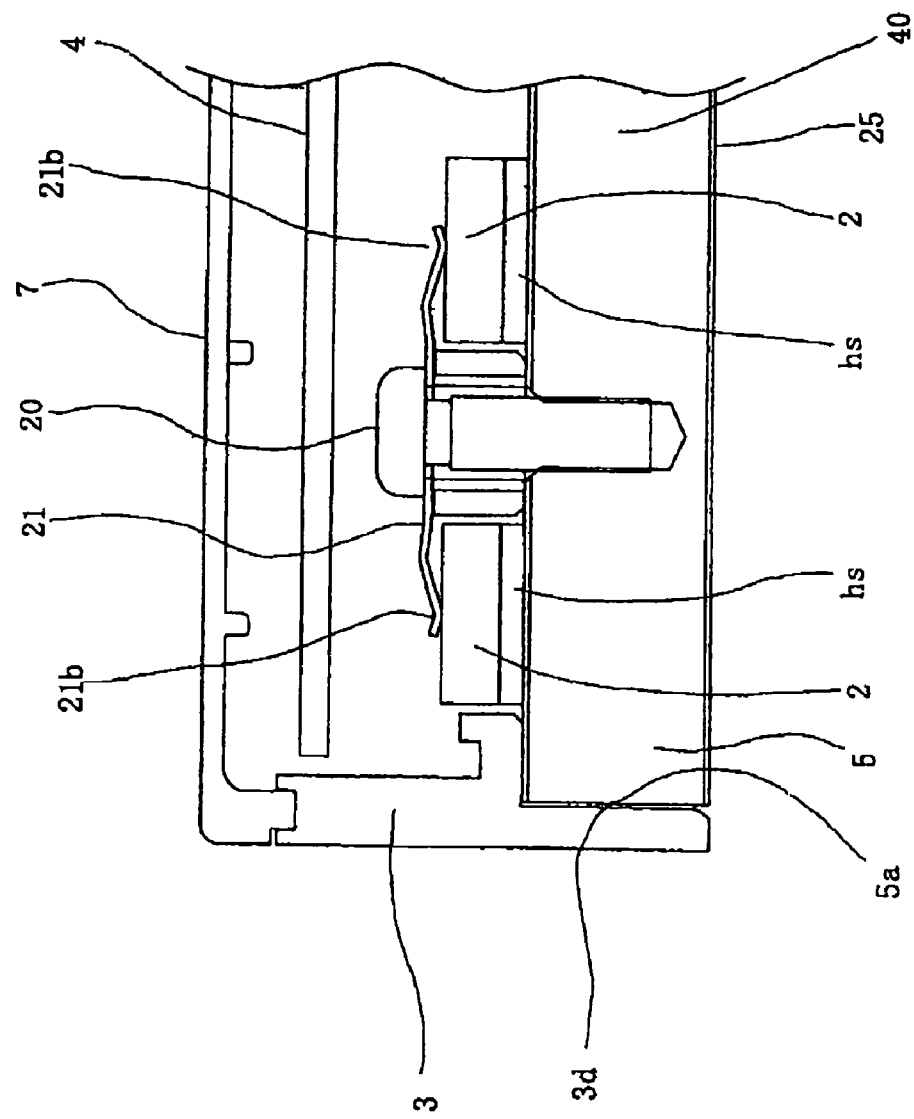
FIG. 4 is a cross sectional view obtained by cutting in a direction perpendicular to the cross section of the electronic control device as shown in FIG. 3 in Embodiment 1 of the present invention.

FIG. 1 is an exploded perspective view showing an electronic control device 1 according to Embodiment 1 of the present invention. FIG. 2 is a cross sectional view showing the electronic control device 1 of FIG. 1 according to Embodiment 1 of the present invention. FIG. 3 is a cross sectional view obtained by cutting at a position parallel to the cross section of FIG. 2 in Embodiment 1 of the present invention. FIG. 4 is a cross sectional view obtained by cutting in a direction perpendicular to the cross section of FIG. 3 in Embodiment 1 of the present invention.

Figure 5:
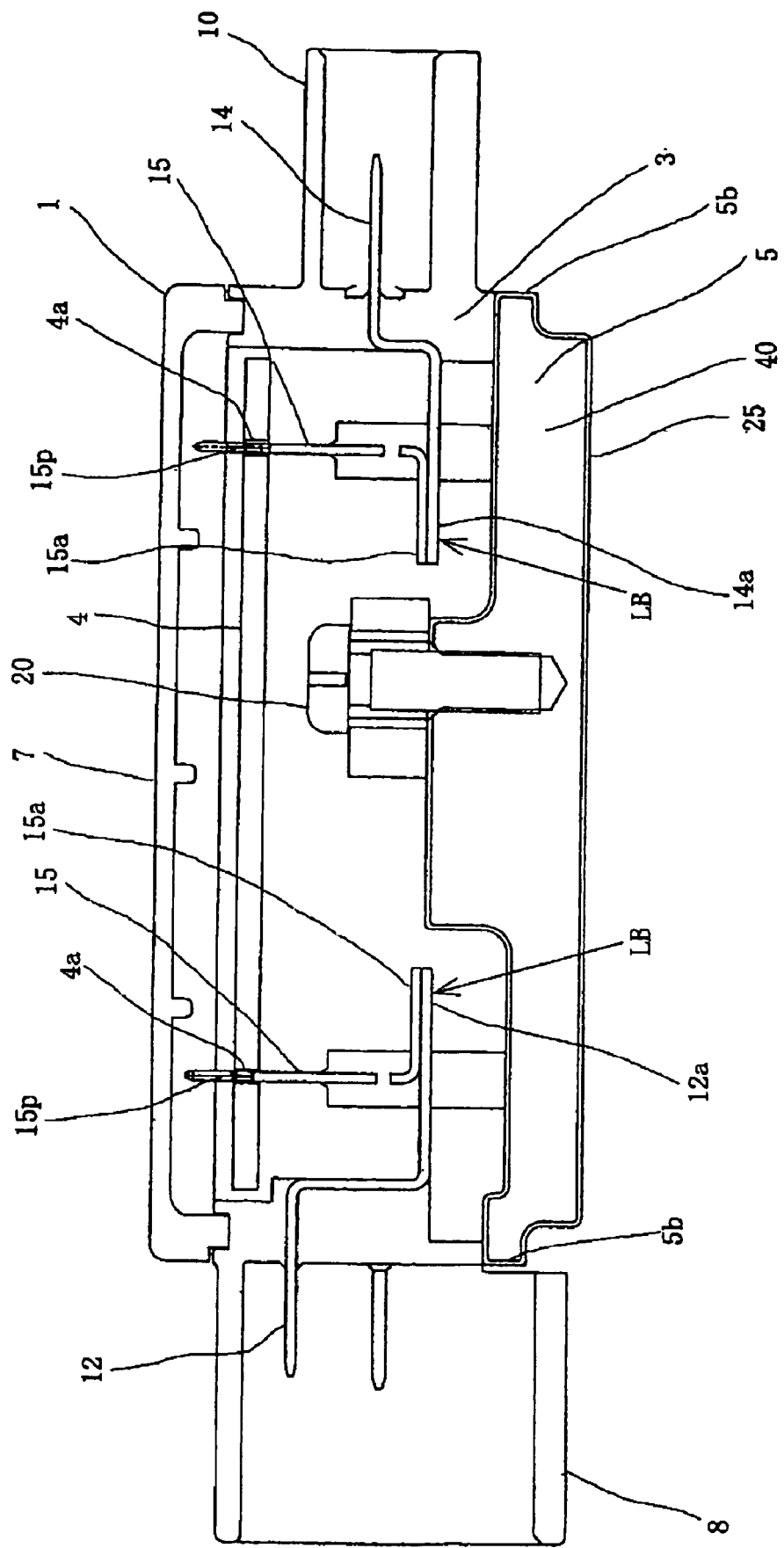
FIG. 5 is a cross sectional view obtained by cutting at a position parallel to the cross section of the electronic control device as shown in FIG. 2 in Embodiment 1 of the present invention.
Figure 6:
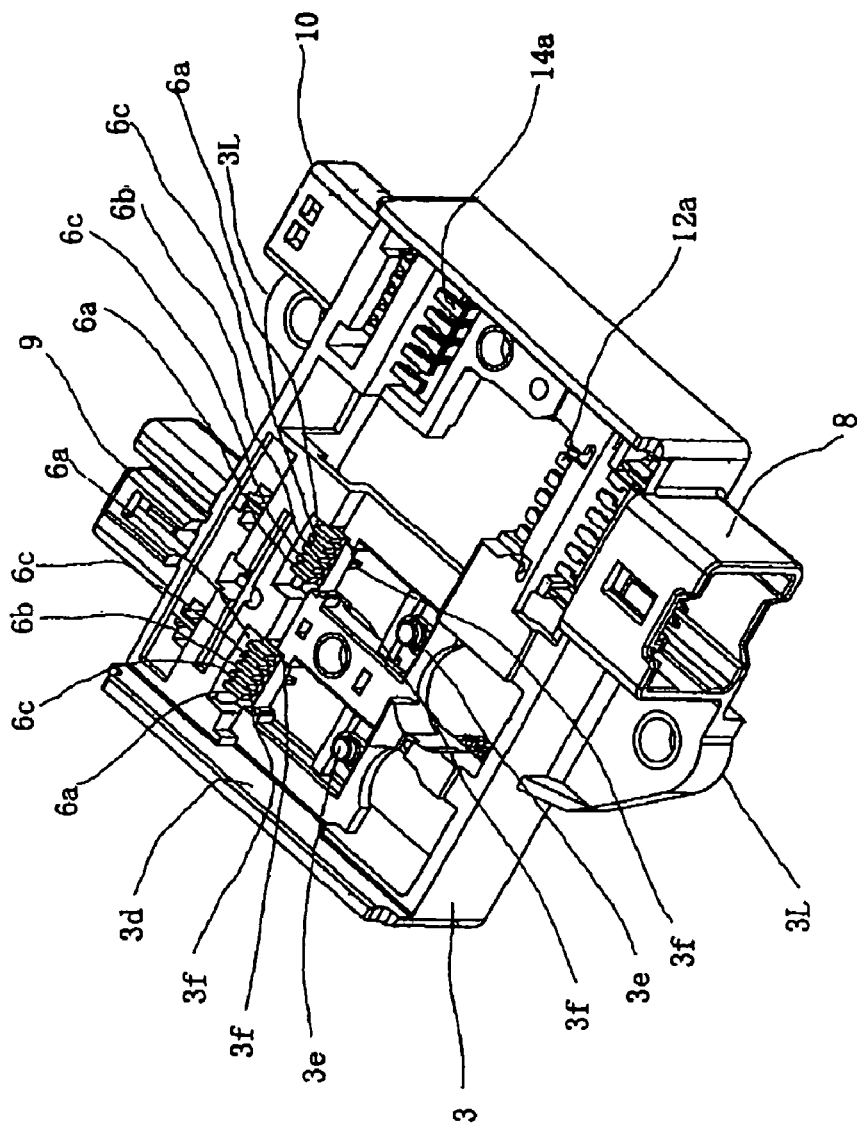
FIG. 6 is a perspective view showing a main part of the electronic control device of FIG. 1 according to Embodiment 1 of the present invention.
Figure 7:
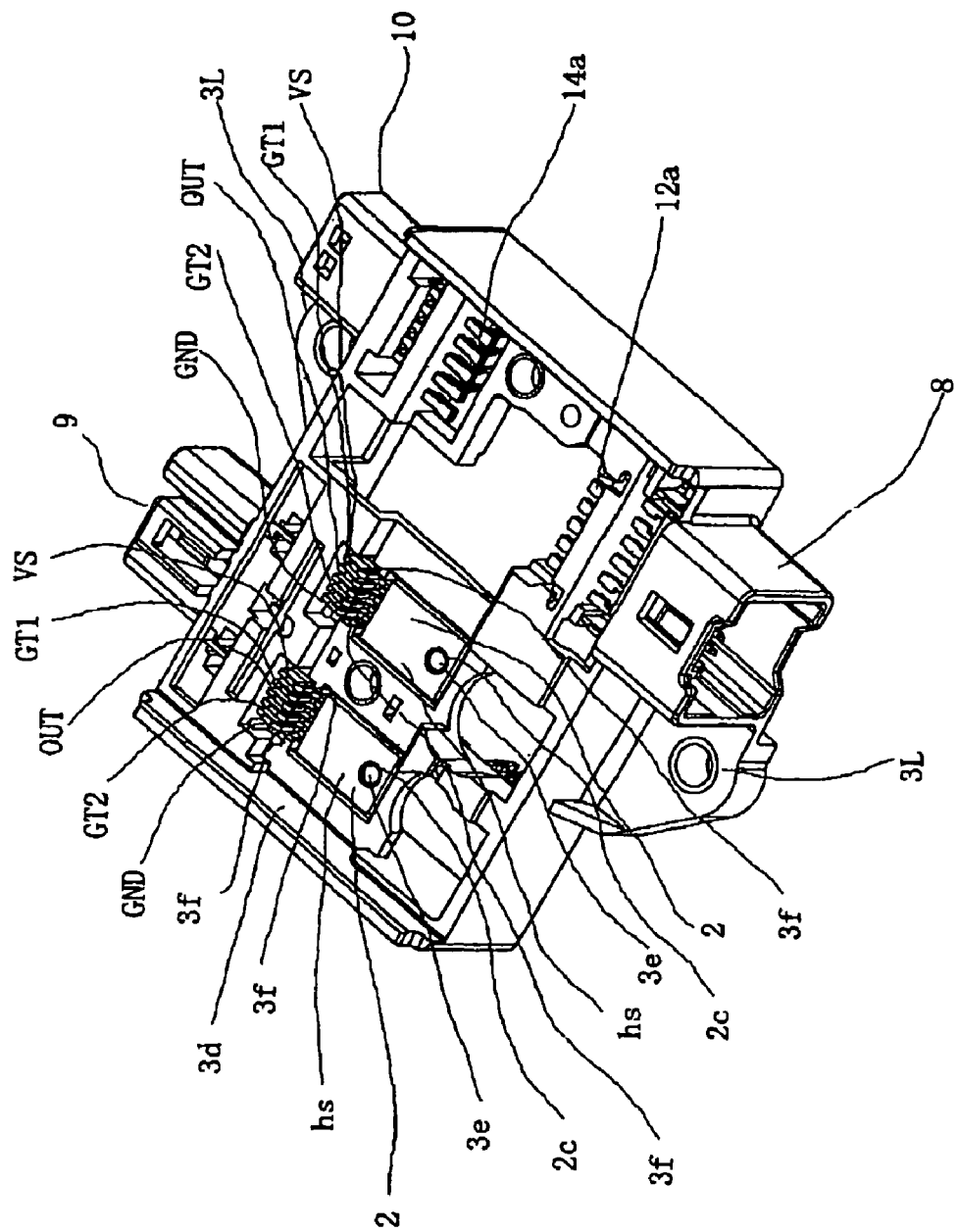
FIG. 7 is a perspective view showing the main part of the electronic control device of FIG. 1 according to Embodiment 1 of the present invention.
Figure 8:
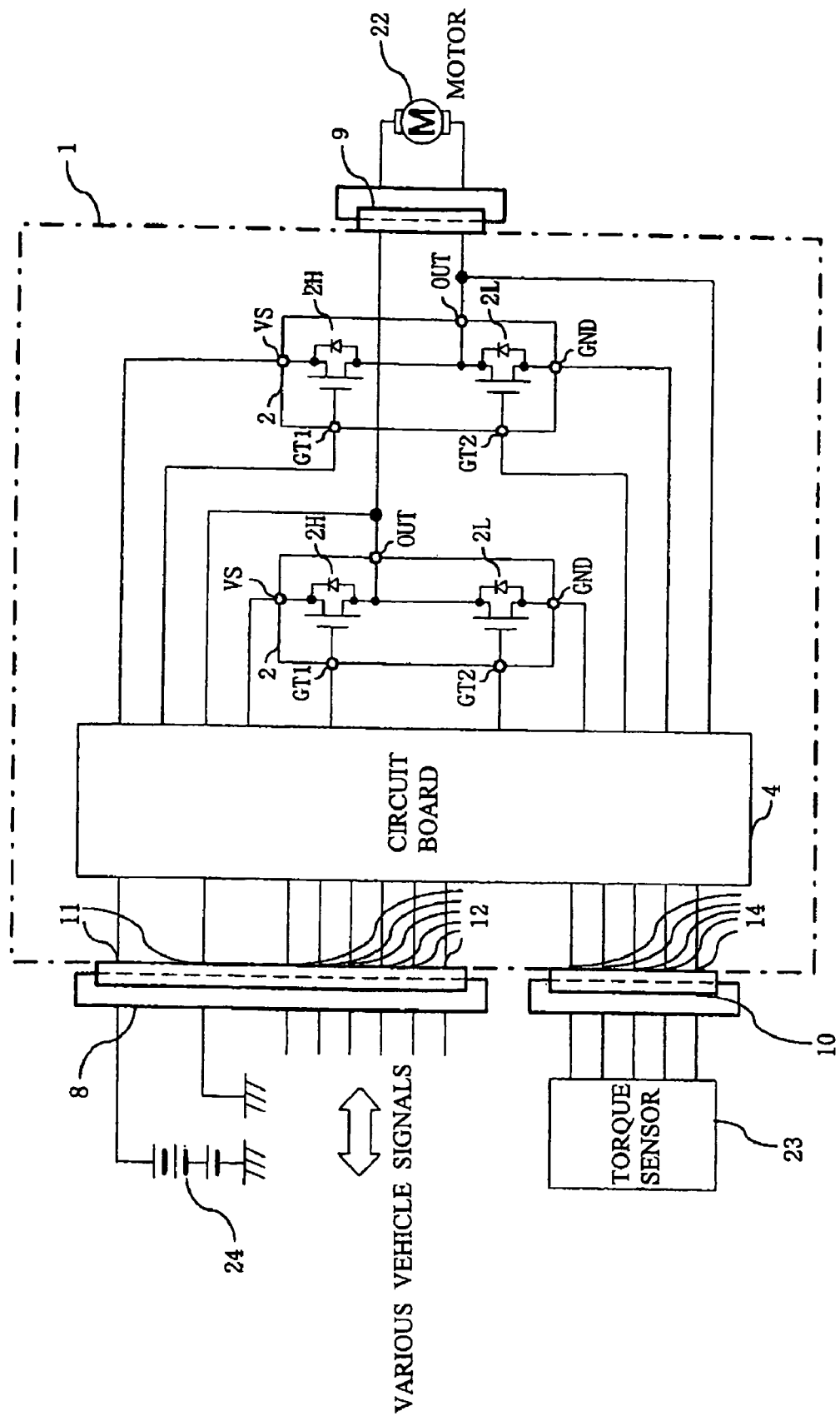
FIG. 8 is a block diagram showing an electric power steering apparatus of FIG. 1 in Embodiment 1 of the present invention.

FIG. 5 is a cross sectional view obtained by cutting at a position parallel to the cross section of FIG. 2 in Embodiment 1 of the present invention, which is a cross sectional view obtained at a position different from that in FIG. 3. FIGS. 6 and 7 are perspective views showing a main part of the electronic control device 1 of FIG. 1 according to Embodiment 1 of the present invention FIG. 8 is a block diagram showing an electric power steering apparatus of FIG. 1 in Embodiment 1 of the present invention.

The electronic control device 1 includes semiconductor switching devices 2, a housing 3, a circuit board 4, a heat sink 5 made of aluminum, a first conductive plate 6, a cover 7, a vehicle connector 8, a motor connector 9, and a sensor connector 10. The housing 3 includes opening portions located at both ends thereof. The heat sink 5 made of aluminum is attached to one of both ends of the housing 3. The semiconductor switching devices 2 serving as power devices are mounted to the heat sink 5.

The circuit board 4 is disposed opposite to the heat sink 5 and provided with an electric circuit including a control circuit for controlling the semiconductor switching devices 2. The first conductive plate 6 includes power conductive plates 6a, an output conductive plate 6b, and signal conductive plates 6c. The first conductive plate 6 has a base portion which is integrally formed with the housing 3 by insert molding using an insulating resin 3a and electrically connects the circuit board 4 to the semiconductor switching device 2.

The cover 7 is attached to the other of the ends of the housing 3. The semiconductor switching devices 2 and the circuit board 4 are stored in the housing 3 by the heat sink 5 and the cover 7 which are provided at both ends of the cover 7.

The vehicle connector 8 is provided to a side surface of the housing 3 and electrically connected with vehicle wirings. The vehicle connector 8 includes: power supply connector terminals 11 electrically connected with a vehicle battery 24; and signal connector terminals 12 serving as third conductive plates, each of which receives and outputs signals through the vehicle wirings, has a thickness of 0.64 mm, and is made of phosphor bronze.

The motor connector 9 is electrically connected with an electric power motor 22. The motor connector 9 includes motor connector terminals 13, each of which has a thickness of 0.8 mm and is made of copper alloy or phosphor bronze having high electrical conductivity.

The sensor connector 10 is provided to another side surface of the housing 3 and electrically connected with a torque sensor 23. The sensor connector 10 includes sensor connector terminals 14 serving as third conductive plates, each of which has a thickness of 0.64 mm and is made of phosphor bronze.

Terminals 15 serving as second conductive plates each having a thickness of 0.6 mm, are made of phosphor bronze, and are formed in an L-shape. The terminals 15 serving as the second conductive plates are electrically connected with the signal connector terminals 12 and the sensor connector terminals 14 each serving as the third conductive plates and the circuit board 4.

The parts including the power supply connector terminals 11, the signal connector terminals 12, the motor connector terminals 13, the sensor connector terminals 14, and the terminals 15 are simultaneously formed by insert molding when the power conductive plates 6a, the output conductive plate 6b, and the signal conductive plates 6c are to be formed by insert molding to provide the housing 3. As a result, the vehicle connector 8, the motor connector 9, and the sensor connector 10 are integrally formed with the housing 3.

An attachment leg portion 3L for attaching the electronic control device 1 to a vehicle which is an attached object is formed to a side surface of the housing 3, which is located on an opening portion side opposed to the opening portion to which the heat sink 5 is attached.

The heat sink 5 includes a heat sink main body 40 and an alumite coating 25 serving as an insulating coating which is formed on a surface of the heat sink main body 40. In order to manufacture the heat sink 5, first, aluminum or an aluminum alloy is extruded from a die to produce a long extrusion member whose cross section is convex. Next, the alumite coating 25 is formed on the entire surface of the extrusion member in advance to produce a heat sink material. The heat sink material is cut into a desirable length by a cutting machine and subjected to machining processing such as drilling to form the heat sink 5.

Of four external end surfaces of the heat sink 5 formed by cutting using the cutting machine, one pair of both side end surfaces 5a each are a cut surface in which the heat sink main body 40 is exposed to the outside. The other pair of both side end surfaces 5b are formed with the alumite coating 25 (see FIG. 1). The alumite coating 25 is formed on a surface of the heat sink 5 to which the semiconductor switching devices 2 are provided and a rear surface thereof. As shown in FIG. 4, the cut surface of each of the one pair of both side end surfaces 5a is opposed to an inner wall surface 3d of the housing 3.

The case where the heat sink 5 is manufactured using the extrusion member is described here. However, the heat sink 5 may be manufactured by performing cutting processing on the heat sink material which is hot or cold forged. The heat sink 5 may be manufactured by performing cutting processing on a plate material which is hot or cold rolled. All or a part of four external end surfaces of the heat sink main body 40 may be exposed to the outside to oppose the exposed surface to the inner wall surface 3d.

As shown in FIG. 8, each of the semiconductor switching devices 2 integrates a high-side MOSFET 2H and a low-side MOSFET 2L. The high-side MOSFET 2H and the low-side MOSFET 2L form a half bridge. The semiconductor switching device 2 in which the half bridge is formed is stored in a package. The two half bridges are used as a pair to construct a bridge circuit for switching a current of the electric power motor 22.

Terminals of each of the semiconductor switching devices 2, that is, a supply power terminal VS, a gate terminal GT1 of the high-side MOSFET 2H, a bridge output terminal OUT, a gate terminal GT2 of the low-side MOSFET 2L, and a ground terminal GND are arranged in this order from the right in FIG. 7.

Each of the supply power terminal VS, the bridge output terminal OUT, and the ground terminal GND is a large-current terminal into which a large current from the electric power motor 22 flows. On the other hand, each of the gate terminal GT1 and the gate terminal GT2 is a small-current terminal into which a small current for signal flows. Therefore, the large-current terminals and the small-current terminals are alternately arranged.

A microcomputer 16 is mounted on a wiring pattern of the circuit board 4 by soldering. Although not shown in FIG. 1, elements for motor current detecting circuit, peripheral circuit, and the like are mounted on the wiring pattern of the circuit board 4 by soldering. Specific examples of the elements for motor current detecting circuit, peripheral circuit, and the like include a coil for preventing an electromagnetic noise generated at the time of an switching operation of the semiconductor switching device 2 from flowing to the outside, a condenser for absorbing a ripple of a motor current, and a shunt resistor for detecting the motor current.

The circuit board 4 includes a plurality of through holes 4a each having a copper plated inner surface electrically connected with the wiring pattern.

The power conductive plates 6a have base end portions connected with respective tip end portions of the supply power terminal VS and the ground terminal GND of the semiconductor switching device 2. The output conductive plate 6b has a base end portion connected with tip end portions of the bridge output terminals OUT. The signal conductive plates 6c have base end portions connected with respective tip end portions of the gate terminals GT1 and GT2.

The power conductive plates 6a, 6b, and 6c further have press fit terminal portions 6ap, 6bp, and 6cp. The press fit terminal portions 6ap, 6bp, and 6cp are press-fitted into the through holes 4a of the circuit board 4. As a result, the terminals VS, GT1, OUT, GT2, and GND of the semiconductor switching device 2 are electrically connected with the wiring pattern of the circuit board 4.

The conductive plates 6a, 6b, and 6c extend in a leading direction of the terminals VS, GT1, OUT, GT2, and GND of the semiconductor switching device 2 so as to be arranged in overlapping relation. The terminals VS, GT1, OUT, GT2, and GND are located on surfaces of the conductive plates 6a, 6b, and 6c which are opposed to the heat sink 5. The terminals VS, GT1, OUT, GT2, and GND of the semiconductor switching device 2 are formed in a width of 0.8 mm, a thickness of 0.5 mm, and a terminal interval of 1.7 mm.

A large current flows into the power conductive plates 6a and the output conductive plate 6b. Since the power conductive plates 6a and the output conductive plate 6b are made of rolled copper alloy, when roll surfaces (front surfaces) of the conductive plates 6a and 6b are welded to the terminals VS, OUT, and GND of the semiconductor switching device 2, it is necessary to increase a plate thickness of the power conductive plates 6a and the output conductive plate 6b. However, it is difficult to increase the plate thickness in view of the formation and press processing of the press fit terminal portions.

Therefore, in Embodiment 1, the plate thickness of the power conductive plates 6a and the output conductive plate 6b is set to 0.8 mm equal to the width of the terminals VS, OUT, and GND. In contrast to this, the plate width is set to a value larger than the plate thickness. End surfaces perpendicular to the roll surfaces are welded to the terminals VS, OUT, and GND of the semiconductor switching device 2.

That is, the conductive plates 6a and 6b are formed such that a size thereof in a bonding direction with the terminals VS, OUT, and GND is larger than a size thereof in a perpendicular direction (width direction) to the bonding direction. A small current flows into the conductive plates 6c used for signal, so it is unnecessary to take a reduction in electrical resistance into account. However, the conductive plates 6c are made of the same plate material as those of the power conductive plates 6a and the output conductive plate 6b into which a large current flows.

The conductive plates 6a, 6b, and 6c are made of copper alloy or phosphor bronze having a high strength and high electrical conductivity in view of electrical conductivity required to supply a large current and mechanical strength required to form the press fit terminal portions 6ap, 6bp, and 6cp. The phosphor bronze is used in the case where the motor current is, for example, a current equal to or smaller than 30 A.

Each of the terminals VS, GT1, OUT, GT2, and GND of the semiconductor switching device 2 is bent in the same crank shape so as to rise and fall in two intermediate positions, and extended in the same direction. A first bending portion 2a which is a tip end side bending portion of each of the terminals VS, GT1, OUT, GT2, and GND is formed at an acute angle. A second bending portion 2b which is a bending portion located on a main body side of the semiconductor switching device 2 is formed so as to rise at an right angle.

A heat spreader hs serving as a heat radiation portion for each of the semiconductor switching devices 2 is provided on an upper surface of a thick portion of the heat sink 5 having a convex cross section. On the other hand, welding portions of the bent terminals VS, GT1, OUT, GT2, and GND are located above a thin portion of the heat sink 5 having the convex cross section.

As a result, a step is formed between the heat spreader hs and the welding portions of the bent terminals VS, GT1, OUT, GT2, and GND. The step is formed in such a shape that the welding portions of the terminals VS, GT1, OUT, GT2, and GND protrude to the heat spreader hs side.

The alumite coating 25 is formed to the heat sink 5. Therefore, when the welding portions of the terminals VS, GT1, OUT, GT2, and GND are located close to the thin portion, the step can be made larger. The heat sink 5 is not attached at the time of welding, so the main body of the semiconductor switching device 2 does not hinder laser welding.

A laser beam LB is emitted to the surfaces of the terminals VS, GT1, OUT, GT2, and GND from the direction in which the heat sink 5 is attached. Therefore, the heat sink 5 is connected by laser welding.

The terminals VS, GT1, OUT, GT2, and GND are pressed to the first conductive plates 6a, 6b, and 6c by a bending elastic force while the first bending portion 2a is formed at the acute angle. The terminals are welded by emitting the laser beam LB to the vicinities of tip end portions thereof.

At this time, a gap between each of the terminals VS, GT1, OUT, GT2, and GND and corresponding one of the first conductive plates 6a, 6b, and 6c increases from the tip end portion to the first bending portion 2a. Therefore, the vicinities of the tip end portions which are close to the welding portions are pressed to the first conductive plates 6a, 6b, and 6c by a bending elastic force.

As shown in FIG. 6, alignment portions 3e for aligning the main bodies of the semiconductor switching devices 2 with the housing 3 are formed to the housing 3. Each of the alignment portions 3e has a tapered tip end portion. A hole 2c provided in the main body of each of the semiconductor switching devices 2 is guided along the tapered portion and inserted, thereby making the alignment. The alignment portions 3e also serves to make the alignment in the leading direction of the terminals VS, GT1, OUT, GT2, and GND.

Alignment portions 3f for aligning the terminals VS, GT1, OUT, GT2, and GND with the conductive plates 6a, 6b, and 6c are also formed to the housing 3. The alignment portions 3f make the alignment in a direction perpendicular to the leading direction of the terminals VS, GT1, OUT, GT2, and GND.

The alignment portions 3f are formed outside the terminals VS and GND located in both ends of the semiconductor switching device 2 and each of the alignment portions has a tapered tip end portion. The terminals VS and GND of the semiconductor switching device 2 are guided along the tapered portions to align the terminals VS, GT1, OUT, GT2, and GND with the conductive plates 6a, 6b, and 6c.

The terminals VS, GT1, OUT, GT2, and GND of the semiconductor switching device 2 which are aligned by the alignment portions 3e and 3f are welded to the conductive plates 6a, 6b, and 6c. The terminals VS, GT1, OUT, GT2, and GND are arranged in positions shifted from an axis line AX corresponding to a press-fitting direction of the press fit terminal portions 6*ap*, 6*bp*, and 6*cp* and welded to the conductive plates 6*a*, 6*b*, and 6*c*.

The insulating resin 3*a* is interposed between the conductive plates 6*a*, 6*b*, and 6*c* located on an extension of the axis line AX and the heat sink 5. Therefore, a press-fit force at a time when the press fit terminal portions 6*ap*, 6*bp*, and 6*cp* are press-fitted into the through holes 4*a* of the circuit board 4 can be received by the heat sink 5.

Thus, the insulating resin 3*a* which hinders welding can be distanced at the time of laser welding. At the time of press-fitting of the press fit terminal portions 6*ap*, 6*bp*, and 6*cp*, the insulating resin 3*a* can be interposed between the conductive plates 6*a*, 6*b*, and 6*c* and the heat sink 5. That is, such methods are compatible with each other.

The laser beam LB is emitted to the surfaces of the terminals VS, GT1, OUT, GT2, and GND of the semiconductor switching device 2 to connect the semiconductor switching device 2 with the conductive plates 6*a*, 6*b*, and 6*c*. Therefore, it is necessary to prevent the insulating resin 3*a* from being deteriorated or melt-damaged by heat generated by laser welding.

In addition, at the time of laser welding, it is necessary to prevent the insulating resin 3*a* located close to the laser welding portions from being deteriorated or melt-damaged and the press fit terminal portions 6*ap*, 6*bp*, and 6*cp* of the conductive plates 6*a*, 6*b*, and 6*c* from being deteriorated, by reflection light of the laser beam LB which is generated on the surfaces of the terminals VS, GT1, OUT, GT2, and GND.

Further, at the time of laser welding, it is necessary to prevent gases generated from melting portions of the terminals VS, GT1, OUT, GT2, and GND and a gas generated from the insulating resin 3*a* located close to the laser welding portions by laser welding heat, reflection light, or the like, from being deposited onto the press fit terminal portions 6*ap*, 6*bp*, and 6*cp* of the conductive plates 6*a*, 6*b*, and 6*c*.

In Embodiment 1, the base end portions welded to the terminals VS, GT1, OUT, GT2, and GND of the semiconductor switching device 2 are formed in a comb teeth shape to expose from the insulating resin 3*a* of the housing 3. Therefore, the influence of heat and reflection light which are generated at the time of laser welding on the insulating resin 3*a* can be reduced.

The press fit terminal portions 6*ap*, 6*bp*, and 6*cp* of the conductive plates 6*a*, 6*b*, and 6*c* are located on the cover 7 side and the laser welding portions are located on the heat sink 5 side. Therefore, a distance between the press fit terminal portions 6*ap*, 6*bp*, and 6*cp* and the laser welding portions lengthens. As a result, the influence of heat, reflection light, and gases which are generated at the time of laser welding on the press fit terminal portions 6*ap*, 6*bp*, and 6*cp* can be reduced.

The insulating resin 3*a* is interposed between the press fit terminal portions 6*ap*, 6*bp*, and 6*cp* and the laser welding portions. Therefore, reflection light generated at the time of laser welding can be prevented from easily reaching the press fit terminal portions 6*ap*, 6*bp*, and 6*cp*.

The two press fit terminal portions 6*a* p are formed for each of the power conductive plates 6*a*, the single press fit terminal portion 6*bp* is formed for the output conductive plate 6*b*, and the single press fit terminal portion 6*cp* is formed for each of the signal conductive plates 6*c*. That is, the seven press fit terminal portions 6*ap*, 6*bp*, and 6*cp* are provided for each of the semiconductor switching devices 2.

As described above, the terminal interval between the terminals VS, GT1, OUT, GT2, and GND of each of the semiconductor switching devices 2 is 1.7 mm. A hole diameter of the through holes 4*a* of the circuit board 4 into which the press fit terminal portions 6*ap*, 6*bp*, and 6*cp* are press-fitted is set to 1.45 mm.

In Embodiment 1, the press fit terminal portions 6*ap*, 6*bp*, and 6*cp* of adjacent two of the conductive plates 6*a*, 6*b*, and 6*c* are arranged in a staggered manner. Therefore, an interval between the press fit terminal portions 6*ap*, 6*bp*, and 6*cp* is set to a value longer than the interval between the terminals VS, GT1, OUT, GT2, and GND of each of the semiconductor switching devices 2.

End portions 15*a* of the terminals 15 are overlapped with end portions 12*a* of the signal connector terminals 12 and end portions 14*a* of the sensor connector terminals 14. Such overlapped surfaces are formed close to the heat sink 5 and parallel to the heat sink 5 by welding.

At this time, the end portions 12*a* of the signal connector terminals 12 and the end portions 14*a* of the sensor connector terminals 14 are located on the heat sink 5 side. The laser beam LB is emitted to surfaces of the end portions 12*a* of the signal connector terminals 12 and surfaces of the end portions 14*a* of the sensor connector terminals 14 from the direction in which the heat sink 5 is attached, to weld the signal connector terminals 12 and the sensor connector terminals 14 to the terminals 15.

Press fit terminal portions 15*p* of the terminals 15 are formed in end portions opposed to the welding portions. The press fit terminal portions 15*p* are press-fitted into the through holes 4*a* of the circuit board 4. As a result, the signal connector terminals 12 and the sensor connector terminals 14 which are connected with the terminals 15 are electrically connected with the wiring pattern of the circuit board 4.

As in the case of the conductive plates 6*a*, 6*b* and 6*c*, the press fit terminal portions 15*p* of the terminals 15 are located on the cover 7 side and the laser welding portions thereof are located on the heat sink 5 side. Therefore, a distance between the press fit terminal portions 15*p* and the laser welding portions lengthens. As a result, the influence of heat, reflection light, and gases which are generated at the time of laser welding on the press fit terminal portions 15*p* can be reduced.

In the output conductive plate 6*b*, end portions opposed to the base end portions connected with the bridge output terminals OUT of the semiconductor switching devices 2 is connected with the motor connector terminals 13. The motor connector terminals 13 are located on a surface of the end portion of the output conductive plate 6*b* which is opposed to the heat sink 5.

The laser beam LB is emitted to surfaces of the motor connector terminals 13 from the direction in which the heat sink 5 is attached, to weld the motor connector terminals 13 to the output conductive plate 6*b* as in the case where the output conductive plate 6*b* is connected with the bridge output terminals OUT of the semiconductor switching devices 2.

Motor currents outputted from the bridge output terminals OUT of the semiconductor switching devices 2 flow into the electric power motor 22 directly through the motor connector terminals 13 without passing through the circuit board 4. A press fit terminal portion 6*b* p extending to the circuit board 4 is formed in an intermediate portion of the output conductive plate 6*b*. Therefore, signals for monitoring voltages of the motor connector terminals 13 are outputted to the circuit board 4.

The power supply connector terminals 11 are connected with a power supply conductive plate 6*d*. The power supply connector terminals 11 are located on a surface of an end portion of the power supply conductive plate 6*d* which is opposed to the heat sink 5. The laser beam LB is emitted to surfaces of the power supply connector terminals 11 from the direction in which the heat sink 5 is attached, to weld the power supply connector terminals 11 to the power supply conductive plate 6d as in the case where the output conductive plate 6b is connected with the motor connector terminals 3.

Press fit terminal portions 6dp extending to the circuit board 4 are formed in intermediate portions of the power supply conductive plate 6d. The press fit terminal portions 6dp are press-fitted into the through holes 4a of the circuit board 4. Therefore, the power supply conductive plate 6d is electrically connected with the wiring pattern of the circuit board 4. A current from the battery 24 is supplied to the circuit board 4 through the power supply connector terminal 11, the power supply conductive plate 6d, and the press fit terminal portion 6dp.

As shown in FIG. 1, a holding member H for holding the circuit board 4 is provided. The holding member H includes press fit terminal portions Hp formed at tip end potions. The holding member H has a function for connecting a ground terminal of the circuit board 4 with the heat sink 5. That is, a slit 21s located in an end of plate spring 21 is press-fitted to the holding member H and the plate spring 21 is fastened to the heat sink 5 together with the housing 3 with a screw 20.

The press fit terminal portions Hp are press-fitted into the through holes 4a of the circuit board 4. Therefore, the wiring pattern of the circuit board 4 is electrically connected with the heat sink 5 through the press fit terminal portions Hp, the holding member H, the plate spring 21, and the screw 20. The circuit board 4 is mechanically held by press fitting the press fit terminal portions 6ap, 6bp, 6cp, 6dp, 15p, and Hp into the through holes 4a.

The conductive plates 6a, 6b, 6c, and 6d, the terminals 15, and the holding members H are formed to the insulating resin 3a of the housing 3 by insert molding. When the press fit terminal portions 6ap, 6bp, 6cp, 6dp, 15p, and Hp are press-fitted, a press-fit force can be received by the heat sink 5 because the insulating resin 3a is interposed between the conductive plates 6a, 6b, 6c, and 6d, the terminals 15, and the holding members H and the heat sink 5. However, because of manufacturing precision, a slight gap occurs between the insulating resin 3a and the heat sink 5.

In the case of press fitting, relative height precision between the press fit terminal portions 6ap, 6bp, 6cp, 6dp, 15p, and Hp and the circuit board 4 is important. However, when the slight gap occurs between the insulating resin 3a and the heat sink 5, the relative height precision deteriorates. Therefore, an adhesive (not shown) is applied to the gap to prevent the influence of the gap.

A resin package surface of the semiconductor switching device 2 is pressed by the plate spring 21. Therefore, the heat spreader hs serving as the heat radiation portion for the semiconductor switching device 2 is fixed in close contact with the upper surface of the thick portion of the heat sink 5. The alumite coating 25 is formed on the fixed surface. Thus, although the heat spreader hs for the semiconductor switching device 2 is electrically connected with the bridge output terminal OUT thereof, the heat spreader hs is electrically insulated from the heat sink 5 by the alumite coating 25.

The surface of the heat sink 5 has small unevenness. Therefore, even when the heat spreader hs for the semiconductor switching device 2 is brought into contact with the heat sink 5 by the action of the plate spring 21, a slight gap occurs. Because of the influence of the slight gap, a heat resistance of a heat conduction path for radiating heat generated by the semiconductor switching device 2 to the heat sink 5 becomes larger. In order to fill the gap, the heat spreader hs and the alumite coating 25 of the heat sink 5 are fixed in close contact with each other using an adhesive resin of a high heat conductivity (not shown) which is interposed therebetween.

Another means for filling the gap between the heat spreader hs of the semiconductor switching device 2 and the heat sink 5 may be a high-heat conductivity grease interposed therebetween.

The plate spring 21 is engaged with holding portions 3b of the housing 3 and fixed with the screw 20 to the heat sink 5 through the housing 3.

The cover 7 is made of the same insulating resin as the housing 3 and welded to an opening surface of the housing 3 by an ultrasonic welding machine. The welding between the cover 7 and the housing 3 may be vibration welding using a vibration welding machine. In the case of vibration welding, the reciprocating vibration of the cover 7 is performed in a surface direction of a bonding surface between the cover 7 and the housing 3 to cause a resin of the cover 7 and a resin of the housing 3 to be melt with each other due to friction heat, thereby bonding the cover 7 to the housing 3.

Laser welding using a laser welding machine may be used instead of the ultrasonic welding. In the case of laser welding, the cover 7 is made of a material whose laser transmittance is large and the housing 3 is made of a material whose laser absorption coefficient is high. When laser light is emitted from the cover 7 side, the laser light passes through the cover 7 and is absorbed in the bonding surface of the housing 3 to generate heat. The heat is transferred to the cover 7 side to heat the cover 7, so the cover 7 and the housing 3 are melted at the bonding surface to be bonded to each other.

The laser welding cannot be used for resin molding which may cause large warping or sinking because it is difficult to focus the laser light on the bonding surface. However, in the case of resin molding which may cause small warping or sinking, the laser welding can be used. The laser welding has an advantage that vibration is not transferred to inner parts because the welding causes no sinking and thus no vibration.

Next, an assembly procedure for the electronic control device 1 having the above-mentioned structure will be described.

First, cream solder is applied onto the circuit board 4 and parts including the microcomputer 16 and elements for peripheral circuit and the like are arranged. After that, the cream solder is melted by a reflow apparatus to solder the respective parts.

Next, the terminals VS, GT1, OUT, GT2, and GND of the semiconductor switching device 2 is bent in the crank shape. As shown in FIGS. 6 and 7, the semiconductor switching device 2 is provided on the housing 3 whose opening portion to which the heat sink 5 is attached is located on the upper side. At this time, the main body of the semiconductor switching device 2 and the terminals VS, GT1, OUT, GT2, and GND thereof are guided and aligned by the alignment portions 3e and 3f to overlap the terminals VS, GT1, OUT, GT2, and GND on the conductive plates 6a, 6b, and 6c.

After that, the laser beam LB is emitted from the side of the terminals VS, GT1, OUT, GT2, and GND of the semiconductor switching device 2 to perform laser welding between the terminal VS and the power conductive plate 6a, laser welding between the terminal GT1 and the signal conductive plate 6c, laser welding between the terminal OUT and the output conductive plate 6b, laser welding between the terminal GT2 and the signal conductive plate 6c, and laser welding between the terminal GND and the power conductive plate 6a.

Similarly, the laser beam LB is emitted from the side of the power supply connector terminals 11 and the side of the motor connector terminals 13 to perform laser welding between the power supply connector terminals 11 and the power supply conductive plate 6d and laser welding between the motor connector terminals 13 and the power conductive plate 6a.

The laser beam LB is emitted to the surfaces of the end portions 12a of the signal connector terminals 12 and the surfaces of the end portions 14a of the sensor connector terminals 14 to laser-weld the signal connector terminals 12 and the sensor connector terminals 14 to the terminals 15.

Next, a thin adhesive resin of a high heat conductivity (not shown) is printed to a portion of the heat sink 5 to which the semiconductor switching device 2 is provided. An adhesive (not shown) is applied to a portion of the heat sink 5 which is opposed to the vicinity of the insulating resin 3a into which the conductive plates 6a, 6b, 6c, and 6d, the terminals 15, and the holding members H are inserted.

After that, the housing 3 of which the laser welding is completed is reversed such that the opening portion to which the heat sink 5 is attached is located on the lower side, thereby locating the housing 3 above the heat sink 5. Then, engaging portions 21b are press-fitted into the insides of the holding portions 3b to engage the plate spring 21 with the housing 3. Simultaneously, the slit 21s is press-fitted to the holding member H.

Next, the plate spring 21 is fixed to the heat sink 5 together with the housing 3 with the screw 20 to press the semiconductor switching device 2 to the heat sink 5 with a pressing portion 21a of the plate spring 21. Then, the adhesive resin and the adhesive are cured in a furnace maintained at a high temperature.

Next, the tip end portions of the press fit terminal portions 6ap, 6bp, 6cp, 6dp, 15p, and Hp are inserted into the through holes 4a of the circuit board 4 to attach the circuit board 4 to an upper portion of the housing 3. Then, the press fit terminal portions 6ap, 6bp, 6cp, 6dp, 15p, and Hp are press-fitted into the through holes 4a by a press machine.

After that, the cover 7 is provided to the opening surface of the housing 3. The housing 3 and the cover 7 are welded to each other by an ultrasonic welding machine. Such a series of operations is performed to complete the assembly of the electronic control device 1.

As described above, according to Embodiment 1, for example, the metal board containing the semiconductor switching devices 2 which has been required up to now is unnecessary, so an electronic control device whose size and cost are reduced can be realized.

The press fit terminal portions are provided on the cover side and the laser welding portions are provided on the heat sink side, so the distance between the press fit terminal portions and the laser welding portions can be lengthened. Therefore, the influence of heat, reflection light, and gases which are generated at the time of laser welding on the press fit terminal portions can be reduced. As a result, the reliability of electrical connection between the press fit terminal portions and the through holes is improved.

The terminals of the power device are bonded to the first conductive plates by melting, so the reliability of bonding is improved.

The laser welding between the terminals of the power device and the first conductive plates is performed by emitting the laser beam LB to the surfaces of the terminals from the side to which the heat sink is attached. Therefore, welding can be performed with a small energy, so preferable laser welding which causes no hollowing is performed. As a result, the reliability of electrical bonding is improved.

The terminals of the power device are arranged in the positions shifted from the axis line corresponding to the press-fitting direction of the press fit terminal portions and welded to the first conductive plates. As a result, the insulating resin which hinders welding can be distanced at the time of laser welding, thereby improving the workability.

At the time of press-fitting of the press fit terminal portions, the insulating resin can be interposed between the conductive plates and the heat sink. As a result, the relative height precision between the press fit terminal portions and the circuit board becomes better. Therefore, the reliability of electrical connection between the press fit terminal portions and the through holes is improved.

Each of the terminals of the power device is formed in the crank shape having the two bending portions. The first bending portion which is the tip end side bending portion of each of the terminals is formed at the acute angle. The second bending portion which is the bending portion located on the main body side of the power device is formed so as to rise at the right angle. As a result, the gap between each of the terminals and corresponding one of the first conductive plates increases from the tip end portion to the first bending portion. Therefore, only the vicinities of the tip end portions which are close to the welding portions are pressed to the first conductive plates by the bending elastic force, thereby improving the workability of laser welding.

The laser welding is performed while the terminals of the power device are in close contact with the vicinities of the welding portions of the conductive plates. Therefore, the reliability of welding is improved.

The heat sink whose cross section is convex is formed. The heat spreader of the power device is provided on the upper surface of the thick portion of the heat sink having the convex cross section. The welding portions of the terminals of the power device are located above the thin portion of the heat sink having the convex cross section. As a result, the step is formed in such a shape that the welding portions of the terminals protrude to the heat spreader side. Therefore, the main body of the power device does not hinder laser welding, so the workability of welding is improved.

The alumite coating serving as the insulating coating is formed to the heat sink. Therefore, the welding portions of the terminals of the power device are located close to the thin portion, so the step can be made larger. As a result, the main body of the power device does not hinder laser welding, thereby improving the workability of welding.

The base end portions of the first conductive plates which are welded to the terminals of the power device are formed in the comb teeth shape to expose from the insulating resin of the housing. As a result, the influence of heat and reflection light which are generated at the time of laser welding on the insulating resin becomes smaller, so the insulating resin can be prevented from being melt-damaged. The laser beam can be prevented from being blocked by gases generated by the melt-damage of the insulating resin. Thus, the quality of laser welding is improved.

The alignment portions for aligning the main bodies of the power devices with the housing and the alignment portions for aligning the terminals of each of the power devices and the first conductive plates are formed to the housing. As a result, the conductive plates and the terminals are easily aligned, thereby improving the workability of welding.

The second conductive plate which is held in the housing and has the press fit terminal portions formed at an end and the third conductive plate which is held in the housing and welded to the second conductive plate are provided. The press fit terminal portions formed to the second conductive plate are press-fitted into the through holes formed in the circuit board. An end of the second conductive plate and an end of the third conductive plate are overlapped in parallel to the heat sink and electrically connected with each other by welding from the surface side opposed to the heat sink.

Therefore, the press fit terminal portions of the second conductive plate are provided on the cover side and the laser welding portions are provided on the heat sink side, so the distance between the press fit terminal portions and the laser welding portions lengthens. As a result, the influence of heat, reflection light, and gases which are generated at the time of laser welding on the press fit terminal portions can be reduced. Thus, the reliability of electrical connection between the press fit terminal portions and the through holes is improved.

A method of manufacturing the electronic control device 1 according to the present invention includes a welding step of bonding terminals of at least a power device to first conductive plates by welding, a fixing step of fixing a housing to a heat sink, and a press-fit step of press-fitting a press fit terminal to a through hole of a circuit board. Therefore, laser welding can be performed from the side to which the heat sink is attached, a distance between a laser welding portion and the press fit terminal lengthens. As a result, the influence of heat, reflection light, and gases which are generated at the time of laser welding on the press fit terminal before press fitting can be reduced. Thus, the reliability of electrical connection between the press fit terminal and the through hole is improved.

Even when spatters are generated and released at the time of welding, the spatters are not deposited to the alumite coating located on the surface of the heat sink. As a result, the reliability of the electronic control device is improved without reduction in insulation property of the alumite coating.

In Embodiment 1 as described above, each of the semiconductor switching devices 2 serving as the power device integrates the high-side MOSFET 2H and the low-side MOSFET 2L which form a half bridge. The half bridge is stored in a package. The two half bridges are used as a pair to compose the bridge circuit for switching the current of the electric power motor 22. However, the high-side MOSFET 2H and the low-side MOSFET 2L may be separately provided to obtain the bridge circuit having the four semiconductor switching devices 2.

The bridge circuit may be composed of the six semiconductor switching devices 2 to control the drive of a three-phase brushless motor. The semiconductor switching device 2 is used as the power device. Another power device such as a diode or a thyristor may be used.

The plate thickness of the conductive plates 6a, 6b, and 6c is set to 0.8 mm. The plate thickness may be set to a plate thickness of such as 1.0 mm. or 1.2 mm in view of, for example, currents flowing into the conductive plates 6a, 6b, and 6c and the interval between the terminals VS, GT1, OUT, GT2, and GND of each of the semiconductor switching devices 2.

The example in which the present invention is applied to the electric power steering apparatus of the vehicle is described. However, the present invention can be applied to an electronic control device which includes a power device and deals with a large current (for example, 25 A or more), such as an electronic control device for an anti-lock block system (ABS) or an electronic control device related to air conditioning, so the same effect can be obtained.

What is claimed is:

1. An electronic control device, comprising:
   a housing including opening portions each being disposed at a corresponding end portion, which housing is made of an insulating resin;
   a heat sink attached to one of the end portions of the housing;
   a power device disposed on the heat sink at a heat sink attachment surface and including power device terminals which extend away from the power device;
   a circuit board which is opposed to the heat sink, provided in the housing, and formed with an electronic circuit including a control circuit for controlling the power device; and
   a plurality of first conductive plates disposed in the housing, between the power device and the circuit board, for electrically connecting the circuit board with the power device terminals,
   wherein each of the plurality of first conductive plates includes a first press fit terminal press-fitted into a respective through hole formed in the circuit board, which plurality of first conductive plates is connected to the circuit board on a surface opposed to the heat sink and welded to the power device terminals on a surface proximate the heat sink.

2. The electronic control device according to claim 1, wherein the terminals of the power device are arranged in positions shifted from an axis line corresponding to a press-fitting direction of the first press fit terminal.

3. The electronic control device according to claim 1, wherein the terminals of the power device each comprises a tip end portion and wherein the power device terminals are welded to the plurality of first conductive plates while the tip end portions are pressed to the plurality of first conductive plates.

4. The electronic control device according to claim 1, wherein:
   the heat sink has a convex cross section;
   the power device is provided on an upper surface of a thick portion of the heat sink having the convex cross section; and
   the terminals of the power device include welding portions arranged above a thin portion of the heat sink having the convex cross section.

5. The electronic control device according to claim 1, wherein the terminals of the power device are welded to the plurality of first conductive plates by laser welding.

6. The electronic control device according to claim 1, wherein the terminals of the power device are laser-welded to the plurality of first conductive plates by emitting a laser beam to surfaces of the terminals of the power device from the housing end portion to which the heat sink is attached.

7. The electronic control device according to claim 1, wherein each power device terminal includes a tip end portion and wherein the power device terminals are formed to widen a gap with the plurality of first conductive plates from the tip end portions to a main body of the power device.

8. The electronic control device according to claim 1, wherein each power device terminal includes a tip end portion and wherein the power device terminals are welded to the plurality of first conductive plates in vicinities of respective tip end portions.

9. The electronic control device according to claim 1, wherein:
   the heat sink has a thick portion, on which the power device is arranged, and a thin portion extending from the thick portion, and
   the terminals of the power device include welding portions which extend away from the heat sink attachment surface of the power device toward the heat sink thin portion.

10. The electronic control device according to claim 1, wherein the heat sink includes an insulating coating formed on at least a surface on which the power device is provided and a surface in a vicinity of the welding portions.

11. The electronic control device according to claim 10, wherein the insulating coating comprises alumite.

12. The electronic control device according to claim 1, wherein the plurality of first conductive plates includes welding portions welded to the terminals of the power device which welding portions are formed in a comb teeth shape to expose from the insulating resin.

13. The electronic control device according to claim 1, wherein the housing includes an alignment portion for aligning the power device.

14. The electronic control device according to claim 1, wherein the housing includes an alignment portion for aligning a main body of the power device and a terminal portion of the power device.

15. The electronic control device according to claim 1, further comprising:
a second conductive plate disposed in the housing and including:
a first end,
a second end, and
a second press fit terminal formed at the second end; and
a third conductive plate disposed in the housing and connected to the second conductive plate and including a first end and a second end, wherein:
the second conductive plate is connected to the circuit board by press-fitting the second press fit terminal of the second conductive plate into a respective through hole formed in the circuit board; and
the first ends of the third conductive plate and the second conductive plate are overlapped in parallel to a surface of the heat sink, on which the power device is disposed, and laser-welded to each other by emitting a laser beam from a surface side proximate the heat sink.

16. The electronic control device according to claim 15, wherein the second end of the third conductive plate includes a connector terminal.

17. A method of manufacturing the electronic control device according to claim 1, comprising:
welding the terminals of the power device to the plurality of first conductive plates;
fixing the housing to the heat sink; and
press-fitting the press fit terminal into the respective through hole of the circuit board.

* * * * *